(12) United States Patent
Chen et al.

(10) Patent No.: US 8,587,057 B2
(45) Date of Patent: Nov. 19, 2013

(54) METAL OXIDE SEMICONDUCTOR FIELD TRANSISTOR

(75) Inventors: Po-An Chen, Miaoli County (TW); Chin-Han Pan, Taipei (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 13/471,469

(22) Filed: May 15, 2012

(65) Prior Publication Data

US 2013/0009218 A1    Jan. 10, 2013

(30) Foreign Application Priority Data

Jul. 8, 2011    (TW) .............................. 100124271 A (51) Int. Cl.
*H01L 29/66* (2006.01)

(52) U.S. Cl.
USPC ..... 257/336; 257/339; 257/342; 257/E29.027

(58) Field of Classification Search
USPC ......... 257/288, 335, 336, 339–343, 346, 367, 257/409, 496, E29.04, E29.12, 257/E29.026–E29.027, E29.054, E29.063, 257/E29.066, E29.118, E29.133–E29.136, 257/E29.262–E29.264, E29.268, E29.427, 257/E29.598
See application file for complete search history.

(56) References Cited

U.S. PATENT DOCUMENTS

| | | | |
|---|---|---|---|
| 5,258,636 | A | 11/1993 | Rumennik et al. |
| 5,633,521 | A | 5/1997 | Koishikawa |
| 6,207,994 | B1 | 3/2001 | Rumennik et al. |
| 2008/0079072 | A1 | 4/2008 | Lee |
| 2008/0197418 | A1 | 8/2008 | Parthasarathy et al. |

OTHER PUBLICATIONS

S.H. Lee, et al., "700V lateral DMOS with new source fingertip design", IEEE, Proceedings of the 20th International Symposium on Power Semiconductor Devices & IC's, May 2008, p. 141-144.

*Primary Examiner* — Steven Loke
*Assistant Examiner* — Juanita B Rhodes
(74) *Attorney, Agent, or Firm* — Jianq Chyun IP Office (57) ABSTRACT

A metal oxide semiconductor field transistor including a source region, a drain region, a gate and a gate dielectric layer is provided. The drain region is located in a substrate. The drain region has an elliptical spiral shape and a starting portion of the drain region is strip or water drop or has a curvature of 0.02 to 0.0025 [1/um]. The source region located in the substrate is around the drain region. The gate is located above the substrate and between the source region and the drain region. The gate dielectric layer is located between the gate and the substrate.

17 Claims, 11 Drawing Sheets

METAL OXIDE SEMICONDUCTOR FIELD TRANSISTOR

CROSS-REFERENCE TO RELATED APPLICATION

This application claims the priority benefit of Taiwan application serial no. 100124271, filed on Jul. 8, 2011. The entirety of the above-mentioned patent application is hereby incorporated by reference herein and made a part of this specification.

BACKGROUND OF THE INVENTION

1. Field of the Invention

The invention relates to a semiconductor device and more particularly to several types of metal oxide semiconductor field transistors.

2. Description of Related Art

Ultra high voltage devices must have high breakdown voltage and low on-state resistance (Ron) during operation to reduce power loss. To provide higher current and maintain sufficient breakdown voltage, array structures are now developed. In layouts of alternating current-direct current electronic products, layout areas can be decreased and the performance of devices can be enhanced through the array structures. In an ultra high voltage device currently developed, a source region and a drain region thereof have a shape of interdigitated fingers. Although a source terminal and a drain terminal having the shape of interdigitated fingers can decrease the layout area, a curvature thereof is large. A large current is particularly accumulated at the source terminal which becomes a breakdown point, thereby resulting in the decrease of the breakdown voltage of the device.

SUMMARY OF THE INVENTION

The embodiment of the invention provides a plurality of metal oxide semiconductor field transistors capable of reducing layout areas and preventing an accumulation of currents at a source terminal and a drain terminal so as to elevate a breakdown voltage of a device and decrease an on-state resistance (Ron) of the device.

According to an embodiment of the invention, a metal oxide semiconductor field transistor including a source region, a drain region, a gate, and a gate dielectric layer is provided. The drain region is located in a substrate and has an elliptical spiral shape. A starting portion of the drain region has a shape of a strip or a water drop, or has a curvature of 0.02 [1/μm] to 0.0025 [1/μm]. The source region is located in the substrate and surrounds the drain region. The gate is located above the substrate and between the source region and the drain region. The gate dielectric layer is located between the gate and the substrate.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

Figure 1:
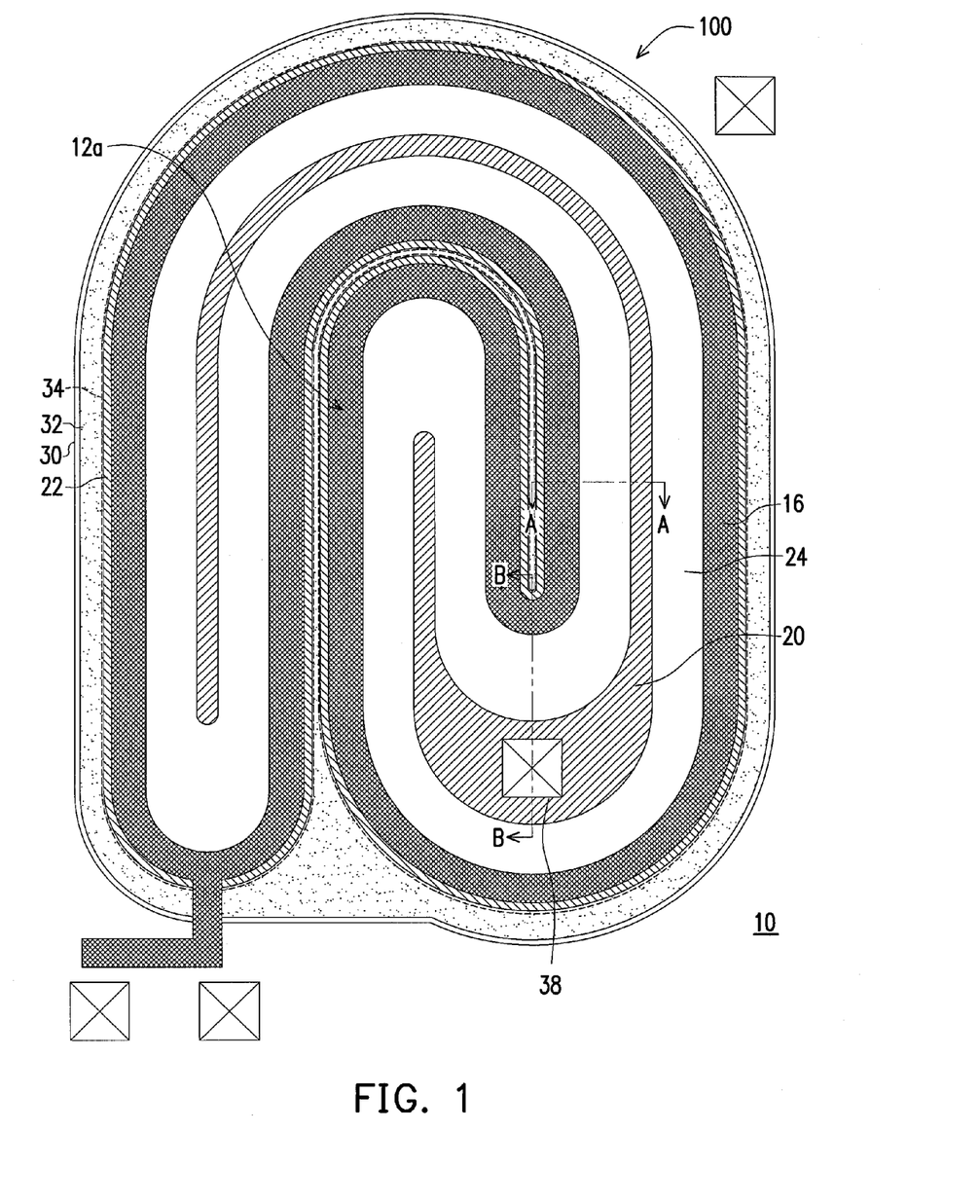
FIG. 1 shows a top view of a metal oxide semiconductor field transistor having an elliptical spiral-shaped drain with a strip-shaped starting portion according to an embodiment of the invention.
Figure 1A:
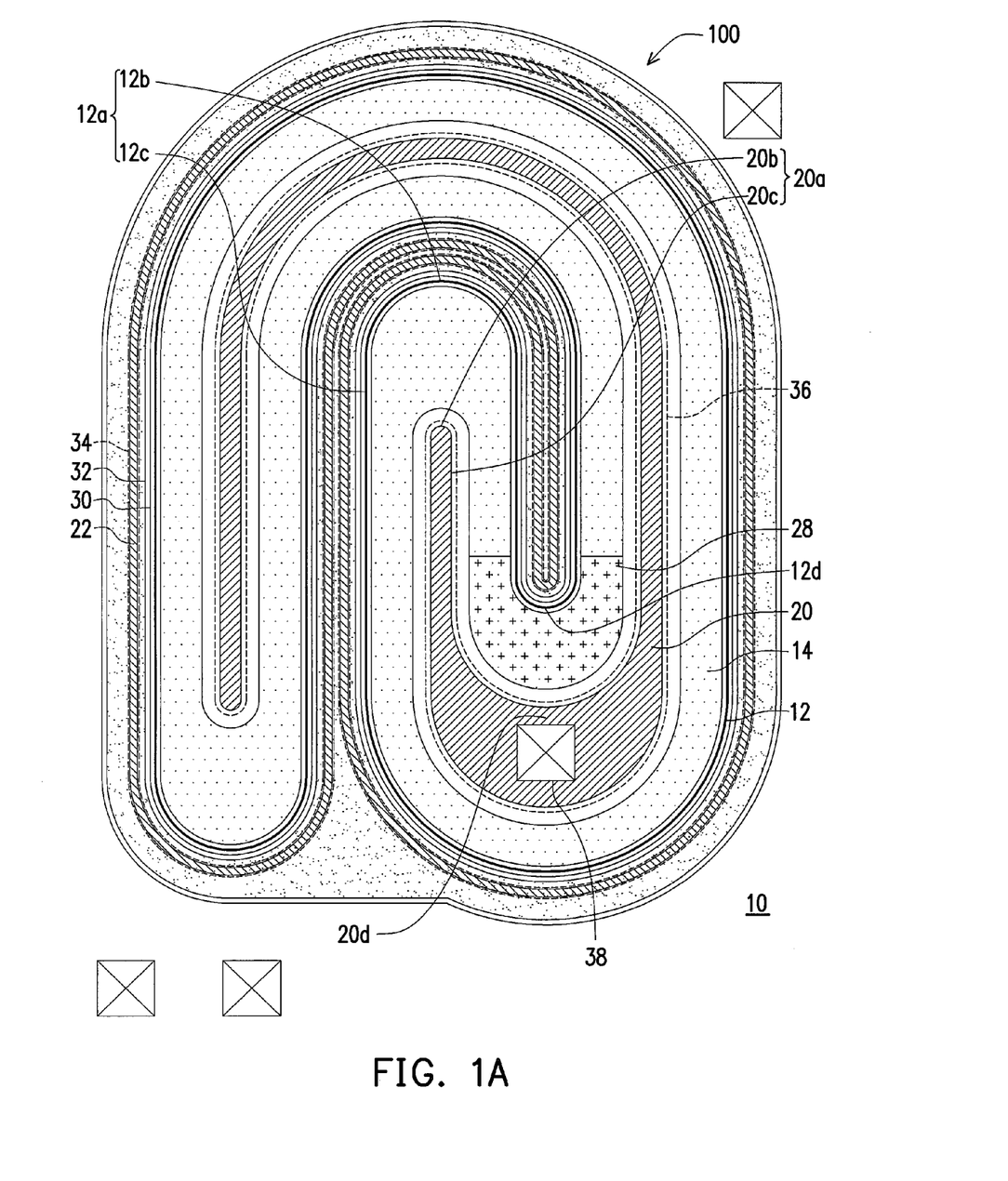
FIG. 1A is a schematic diagram illustrating relative positions of a plurality of doped regions in a substrate of the metal oxide semiconductor field transistor in FIG. 1.
Figure 2A:
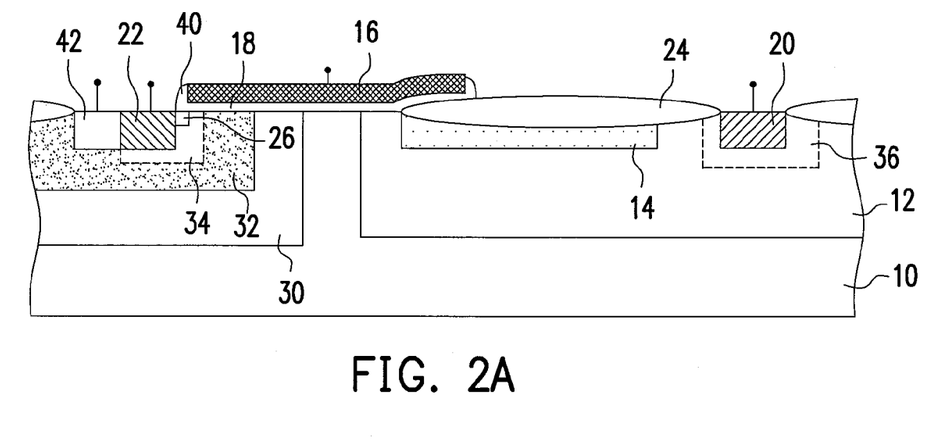
FIG. 2A illustrates a schematic cross-sectional view taken along line A-A in FIGS. 1, and 3-7.
Figure 2B:
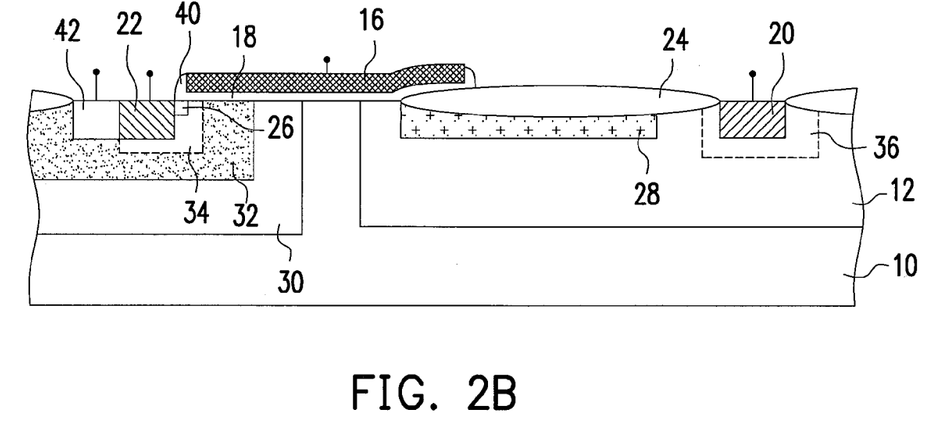
FIG. 2B illustrates a schematic cross-sectional view taken along line B-B in FIGS. 1, 6 and 7.

FIG. 1 shows a top view of a metal oxide semiconductor field transistor having an elliptical spiral-shaped drain with a strip-shaped starting portion according to an embodiment of the invention. FIG. 1A is a schematic diagram illustrating relative positions of a plurality of doped regions after removing a gate 16, a gate dielectric layer 18, and an isolation structure 24 from a substrate of the metal oxide semiconductor field transistor in FIG. 1. FIG. 2A illustrates a schematic cross-sectional view taken along line A-A in FIG. 1. FIG. 2B illustrates a schematic cross-sectional view taken along line B-B in FIG. 1.

Referring to FIGS. 1, 1A, 2A, and 2B, a metal oxide semiconductor field transistor 100 is provided in an embodiment of the invention. The metal oxide semiconductor field transistor 100 has a drain 20 with an elliptical spiral shape. The drain 20 has a starting portion with a strip shape. The metal oxide semiconductor field transistor 100 includes the gate 16, the gate dielectric layer 18, the drain region 20, and a source region 22. The drain region 20 has an elliptical spiral shape (or referred as a paper clip shape), a starting portion 20a thereof has a strip shape. The source region 22 surrounds the drain region 20. In another embodiment, the metal oxide semiconductor field transistor 100 further includes a first well region of a first conductive type (NW1) 12, a first well region of a second conductive type (PW1) 14. To illustrate the relative positions of the elements, the gate 16, the gate dielectric layer 18, the drain region 20, the source region 22, the first well region of the first conductive type (NW1) 12, and the first well region of the second conductive type (PW1) 14 are all shown in FIGS. 1, 1A, 2A, and 2B. The first conductive type can be a P-type or an N-type. The second conductive type can be an N-type or a P-type. In the present embodiment, the first conductive type is an N-type and the second conductive type is a P-type for illustration; however, the invention is not limited thereto.

Figure 2C:
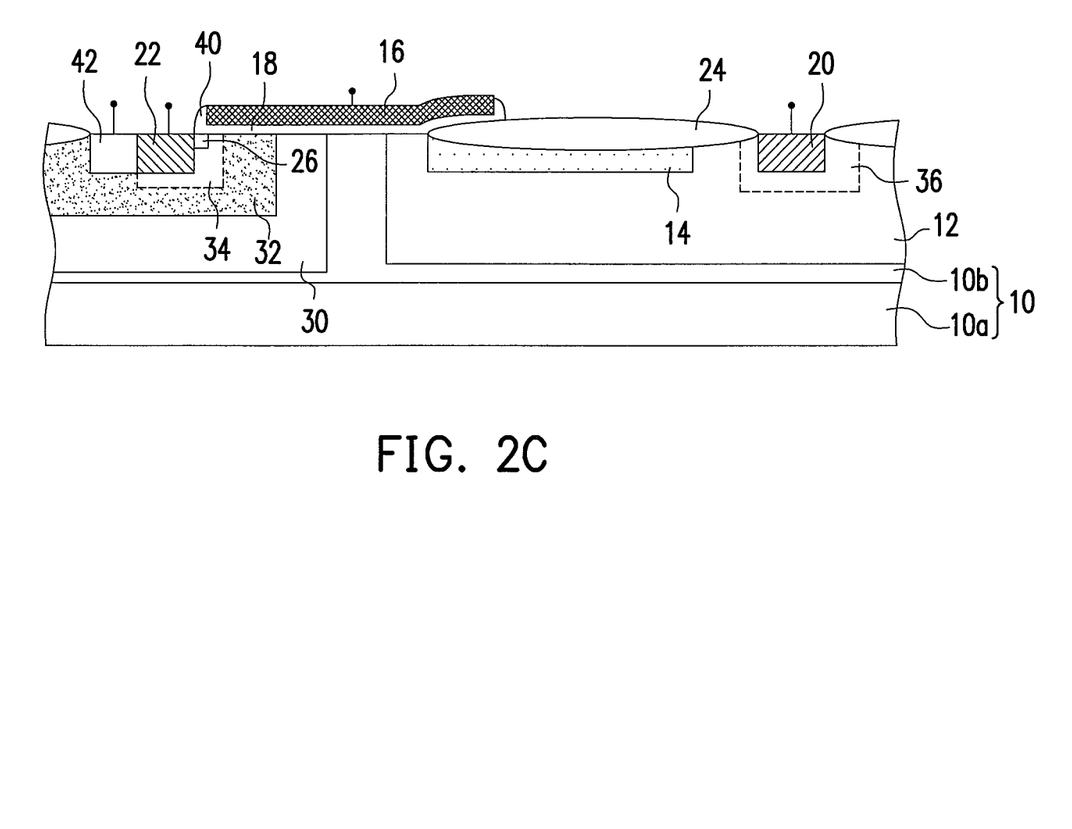
FIG. 2C illustrates a schematic cross-sectional view taken along line A-A in FIGS. 1, and 3-7.

Referring to FIGS. 1, 2A, and 2B, the source region 20 is located in a substrate 10. The substrate 10 is, can be a semiconductor substrate 10, for example, a silicon substrate. The substrate 10 can include a P-type dopant or an N-type dopant therein. The P-type dopant includes group IIIA ions, for example, boron ions. The N-type dopant includes group VA ions, for example, arsenic or phosphorous ions. In another embodiment of the invention (FIG. 2C), the substrate 10 can also include a semiconductor substrate 10b and an epitaxial layer 10b disposed thereon. In the embodiment, the semiconductor substrate 10a is a P-type substrate and the epitaxial layer 10b is a P-type epitaxial layer (p-epi). The drain region 20 has a first conductive type dopant in a spiral shape, which can also be called as a paper clip shape. The first conductive type dopant is located in the first well region of the first conductive type (NW1) 12, for instance. The starting portion 20a of the drain region 20 has a strip shape. Specifically, in an embodiment, the starting portion 20a of the drain region 20 is constituted by an arc portion 20b and a rectangular portion 20c. In another embodiment, other than a semi-circle, the arc portion 20b can also have other arc shapes, for example, a quarter circle, an one-eighth circle, and so on, and the details are omitted hereinafter. A curvature of arc shapes such as the semi-circle, the quarter circle, the one-eighth circle can be, for instance, 0.2 [1/μm] to 0.02 [1/μm]. In another embodiment, the starting portion 20a can also have a rectangular shape. In an embodiment, a doping dosage of the drain region 20 is $5 \times 10^{14}$ to $8 \times 10^{15}/cm^2$, for example.

Referring to FIGS. 1, 1A, 2A, and 2B, the first well region of the first conductive type (NW1) 12 is disposed between the drain region 20 and the substrate 10. In an embodiment, the first well region of the first conductive type (NW1) 12 and the drain region 20 have similar shapes, for example, an elliptical spiral shape, where a starting portion 12a has a strip shape. To be specific, the starting portion 12a of the first well region of the first conductive type (NW1) 12 is constituted by an arc portion 12b and a rectangular portion 12c. Nonetheless, the shape of the first well region of the first conductive type (NW1) 12 is not limited thereto. A first turn of the first well region of the first conductive type (NW1) 12 has a semi-circular shape. The first well region of the first conductive type (NW1) 12 and the drain region 20 can be of different shapes as long as the drain region 20 is located in the first well region of the first conductive type (NW1) 12. The possible shapes are not illustrated in details hereinafter. A doping dosage of the first well region of the first conductive type (NW1) 12 is lower than the doping dosage of the drain region 20. In an embodiment, the doping dosage of the first well region of the first conductive type (NW1) 12 is, for example, $5 \times 10^{11}$ to $2 \times 10^{13}/cm^2$.

Referring to FIGS. 1, 1A, 2A, and 2B, a metal oxide semiconductor field transistor 100 is provided in an embodiment of the invention. The metal oxide semiconductor field transistor 100 has a drain 20 with an elliptical spiral shape. The drain 20 has a starting portion with a strip shape. The metal oxide semiconductor field transistor 100 includes the gate 16, the gate dielectric layer 18, the drain region 20, and a source region 22. The drain region 20 has an elliptical spiral shape (or referred to as a paper clip shape), a starting portion 20a thereof has a strip shape. The source region 22 surrounds the drain region 20. In another embodiment, the metal oxide semiconductor field transistor 100 further includes a first well region of a first conductive type (NW1) 12, a first well region of a second conductive type (PW1) 14. To illustrate the relative positions of the elements, the gate 16, the gate dielectric layer 18, the drain region 20, the source region 22, the first well region of the first conductive type (NW1) 12, and the first well region of the second conductive type (PW1) 14 are all shown in FIGS. 1, 1A, 2A, and 2B. The first conductive type can be a P-type or an N-type. The second conductive type can be an N-type or a P-type. In the present embodiment, the first conductive type is an N-type and the second conductive type is a P-type for illustration; however, the invention is not limited thereto.

Referring to FIGS. 1, 1A, 2A, and 2B, the isolation structure 24 is located above the substrate 10. The isolation structure 24 surrounds the drain region 20 tightly and covers the first well region of the second conductive type 14. The isolation structure 24 is, for example, a local thermal oxidation isolation structure made of an insulation material, for example, silicon oxide.

Referring to FIGS. 1, 1A, and 2A, the source region 22 has a first conductive type dopant which is located in the substrate 10 and surrounds the drain region 20. More specifically, the source region 22 can enclose the drain region 20 entirely. Having the drain region 20 completely enclosed by the source region 22, when the metal oxide semiconductor field transistor is adopted as a high voltage device, a high voltage applied to the drain region 20 (e.g. tens to hundreds of volts), the drain region 20 can be isolated by the source region 22 effectively, thereby alleviating the influence from the high voltage to the peripheral devices. The manner of the source region 22 enclosing the drain region 20 entirely is merely one of the embodiments of the invention and the invention is not limited thereto. In an embodiment, a doping dosage of the source region 22 is $5 \times 10^{14}$ to $8 \times 10^{15}/cm^2$, for example. From another perspective, the source region 22 is located at a boundary of the first well region of the first conductive type 12.

Additionally, in an embodiment, the source region 22 is partially coupled to the gate 16 in the metal oxide semiconductor field transistor 100 (not shown). However, in another embodiment, referring to FIGS. 2A and 2B, the source region 22 is not coupled to the gate 16 in the metal oxide semiconductor field transistor 100. Here, the source region 22 and the gate 16 have a distance spaced between, for example, through a process including a spacer 40 is formed on a sidewall of the gate 16. A lightly doped region of the first conductive type (NLDD) 26 is disposed between the source region 22 and the gate 16, for example, in the substrate 10 below the spacer 40. The lightly doped region of the first conductive type (NLDD) 26 is electrically connected to the source region 22 and coupled to the gate 16. A doping dosage of the lightly doped region of the first conductive type (NLDD) 26 is lower than or equal to that of the source region 22. In an embodiment, the doping dosage of the lightly doped region of the first conductive type (NLDD) 26 is, for example, $5 \times 10^{12}$ to $1 \times 10^{14}/cm^2$.

Referring to FIGS. 1, 1A, 2A, and 2B, in an embodiment, when the source region 22 at the first turn 12d of the first well region of the first conductive type 12 having the elliptical spiral shape has a large curvature, for example, 0.5 [1/μm] to 0.05 [1/μm], the metal oxide semiconductor field transistor 100 further includes a second well region of the second conductive type (PW2) 28. The second well region of the second conductive type (PW2) 28 is located in the first well region of the second conductive type 14 and specifically located surrounding the source region 22 at the first turn 12d of the first well region of the first conductive type 12 having the elliptical spiral shape. The second well region of the second conductive type (PW2) 28 can decrease an electric field effect at the first turn 12d (a tip of the source region 22) of the first well region of the first conductive type 12 so as to elevate the breakdown voltage of the device. In an embodiment, the second well region of the second conductive type (PW2) 28 has a shape of a horseshoe (or U-shape), for example. However, the shape of the second well region of the second conductive type (PW2) 28 is not limited thereto, and the second well region of the second conductive type (PW2) 28 can have any shape as long as the electric field effect at the first turn 12d (the tip of the source region 22) of the first well region of the first conductive type 12 can be decreased to elevate the breakdown voltage of the device. A sum of the doping dosage of the first well region of the second conductive type 14 and a doping dosage of the second well region of the second conductive type 28 is higher than the doping dosage of the first well region of the first conductive type 12. In an embodiment, the sum of the doping dosage of the first well region of the second conductive type 14 and the doping dosage of the second well region of the second conductive type 28 is 1.2 to 5.0 times of the doping dosage of the first well region of the first conductive type 12. The doping dosage of the second well region of the second conductive type (PW2) 28 is, for example, $5 \times 10^{11}$ to $2 \times 10^{13}$/cm².

Referring to FIGS. 1, 1A, 2A and 2B, in an embodiment, the metal oxide semiconductor field transistor 100 further includes a second well region of the first conductive type (NW2) 30 and a third well region of the second conductive type (PW3) 32. The second well region of the first conductive type (NW2) 30 can be adopted as a charge accumulation layer of the metal oxide semiconductor field transistor 100 and is located in the substrate 10 around the first well region of the first conductive type 12. The third well region of the second conductive type (PW3) 32 is located in the second well region of the first conductive type 30 and the source region 22 is located in the third well region of the second conductive type (PW3) 32. From another perspective, the substrate 10 and the source region 22 are spaced by the second well region of the first conductive type (NW2) 30 and the third well region of the second conductive type (PW3) 32. The third well region of the second conductive type (PW3) 32 is located between the source region 22 and the second well region of the first conductive type (NW2) 30. A surface of the third well region of the second conductive type (PW3) 32 below the gate 16 is a channel region. As shown in FIG. 1A, the second well region of the first conductive type (NW2) 30 is located on a surrounding of the first well region of the first conductive type (NW1) 12. The third well region of the second conductive type (PW3) 32 is also located on the surrounding of the first well region of the first conductive type (NW1) 12 and located in the second well region of the first conductive type 30. A doping dosage of the second well region of the first conductive type (NW2) 30 is, for example, $1 \times 10^{12}$ to $5 \times 10^{13}$/cm². A doping dosage of the third well region of the second conductive type (PW3) 32 is, for example, $1 \times 10^{12}$ to $5 \times 10^{13}$/cm².

Additionally, in an embodiment, the source region 22 is partially coupled to the gate 16 in the metal oxide semiconductor field transistor 100 (not shown). However, in another embodiment, referring to FIGS. 2A and 2B, the source region 22 is not coupled to the gate 16 in the metal oxide semiconductor field transistor 100. Here, the source region 22 and the gate 16 have a distance spaced between, for example, through a process of forming a spacer 40 is formed on a sidewall of the gate 16. A lightly doped region of the first conductive type (NLDD) 26 is disposed between the source region 22 and the gate 16, for example, in the substrate 10 below the spacer 40. The lightly doped region of the first conductive type (NLDD) 26 is electrically connected to the source region 22 and coupled to the gate 16. A doping dosage of the lightly doped region of the first conductive type (NLDD) 26 is lower than or equal to that of the source region 22. In an embodiment, the doping dosage of the lightly doped region of the first conductive type (NLDD) 26 is, for example, $5 \times 10^{12}$ to $1 \times 10^{14}$/cm².

Referring to FIGS. 1, 1A, 2A, and 2B, the gate 16 is located on the substrate 10 between the source region 22 and the drain region 20. Specifically, in an embodiment, the gate 16 extends to cover the first well region of the first conductive type 12 and a portion of the first well region of the second conductive type 14 from the source region 22. In another embodiment, the gate 16 covers the heavily doped region of the first conductive type 34, the third well region of the second conductive type 32, the first well region of the first conductive type 12, the second well region of the second conductive type 28, and the first well region of the second conductive type 14 from the source region 22. In an embodiment, the gate 16 and the first well region of the second conductive type 14 are spaced by the isolation structure (or a drifting isolation structure) 24. The gate 16 is made of a conductive material such as metal, polysilicon, doped polysilicon, polycide, or a stacked layer of the above.

Referring to FIGS. 2A and 2B, the gate dielectric layer 18 is located between the gate 16 and the substrate 10. The gate dielectric layer 18 can be constituted by a single material layer. The single material layer is, for instance, a low dielectric constant material or a high dielectric constant material. The low dielectric constant material refers to a dielectric material with a dielectric constant lower than 4, such as silicon oxide or silicon oxynitride. The high dielectric constant material refers to a dielectric material with a dielectric constant higher than 4, such as HfAlO, $HfO_2$, $Al_2O_3$, or $Si_3N_4$. The gate dielectric layer 18 has a thickness ranging from 50 nm to 1500 nm, for example.

Referring to FIGS. 1, and 1A, the metal oxide semiconductor field transistor 100 further includes a contact opening 38 which is electrically connected to a first turn 20d of the drain region 20 having the elliptical spiral shape.

In the metal oxide semiconductor field transistor 100 in the embodiment of FIG. 1, the starting portion 20a of the drain region 20 has a strip shape. However, the first well region of the first conductive type (NW1) 12 of the metal oxide semiconductor field transistor 100 of the invention can have different variations as depicted in FIGS. 3 to 10.

Figure 3:
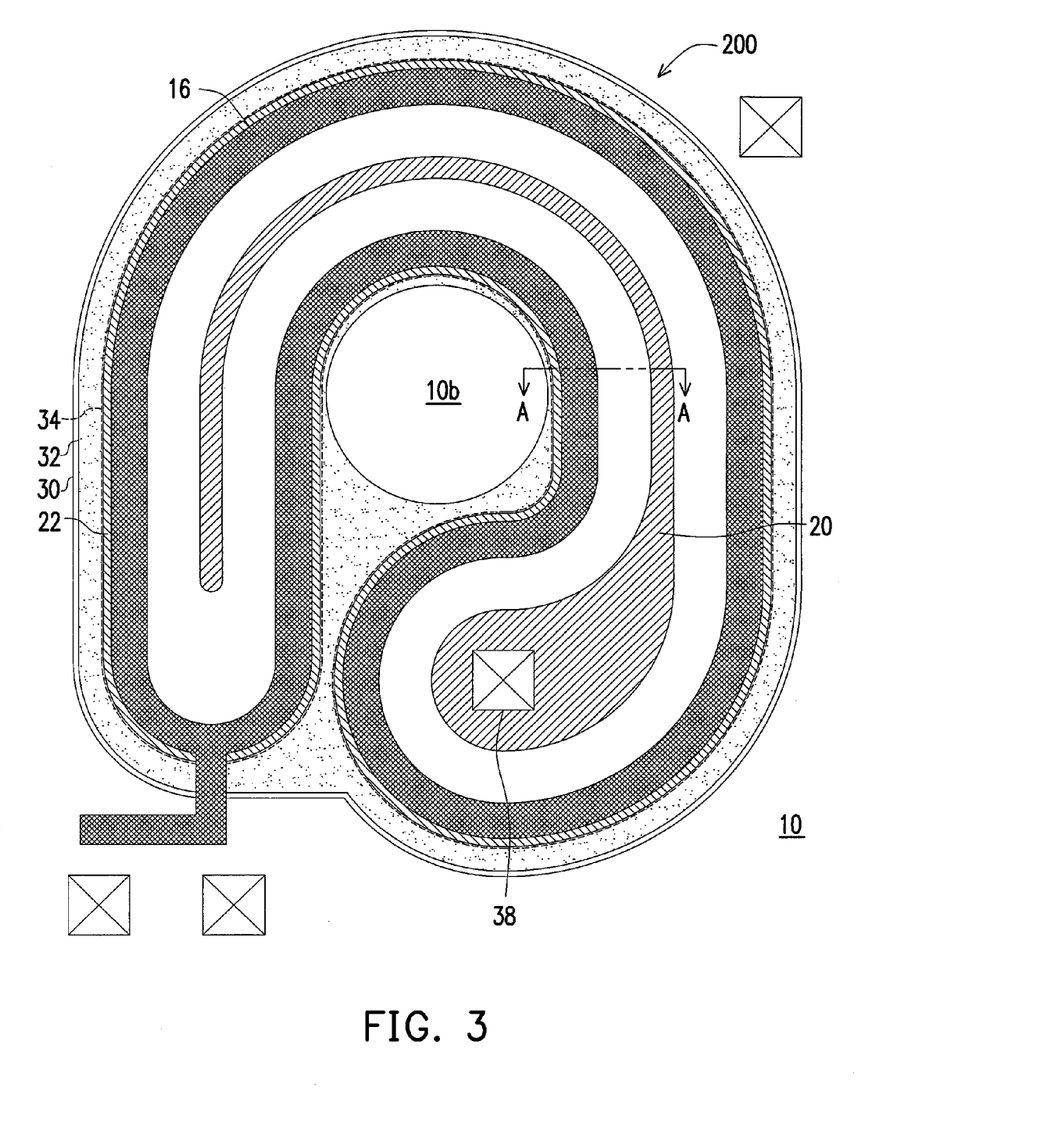
FIG. 3 shows a top view of a metal oxide semiconductor field transistor having a single-looped elliptical spiral-shaped drain with a water drop-shaped starting portion according to another embodiment of the invention.
Figure 3A:
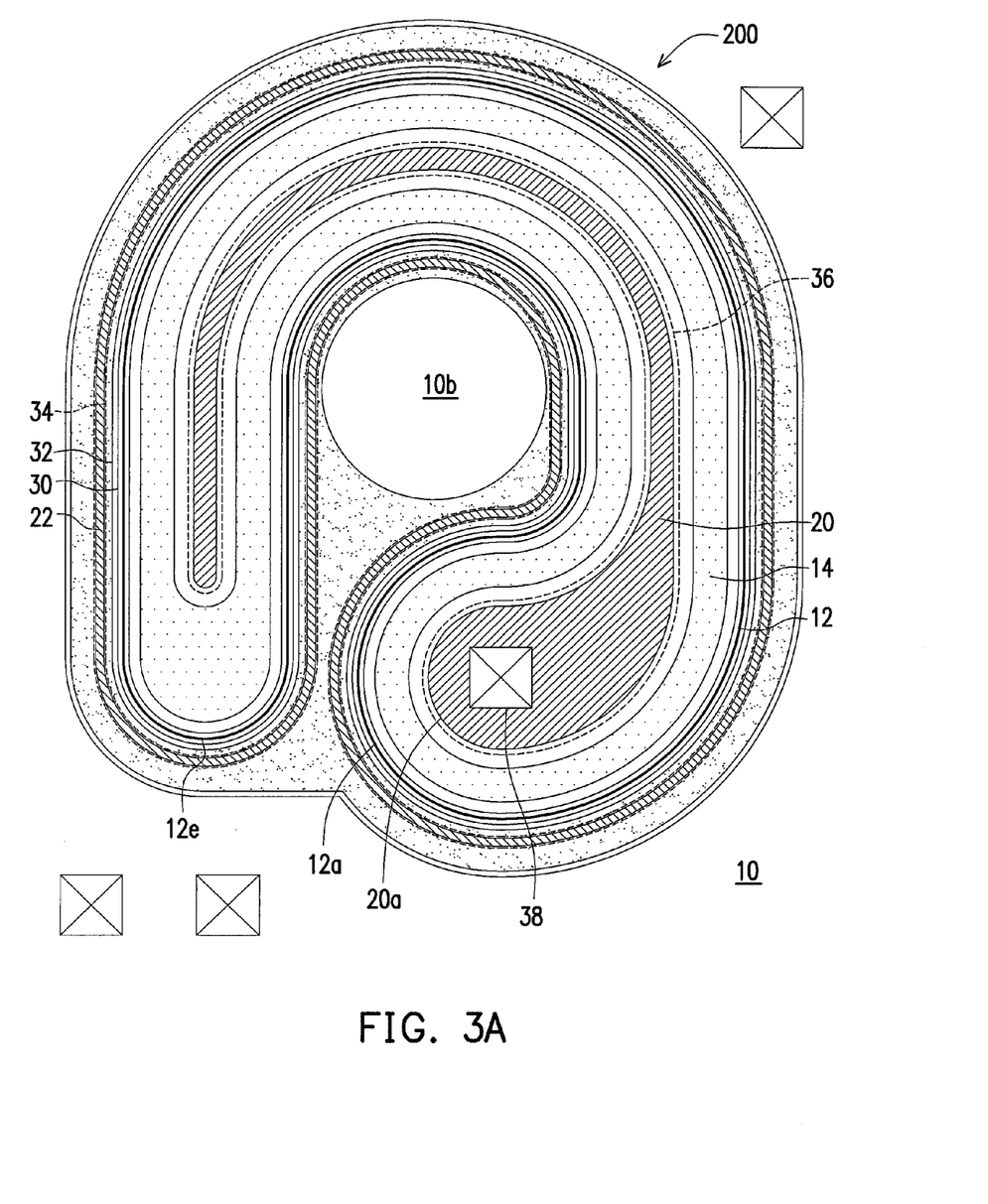
FIG. 3A is a schematic diagram illustrating relative positions of a plurality of doped regions in a substrate of the metal oxide semiconductor field transistor in FIG. 3.
Figure 4:
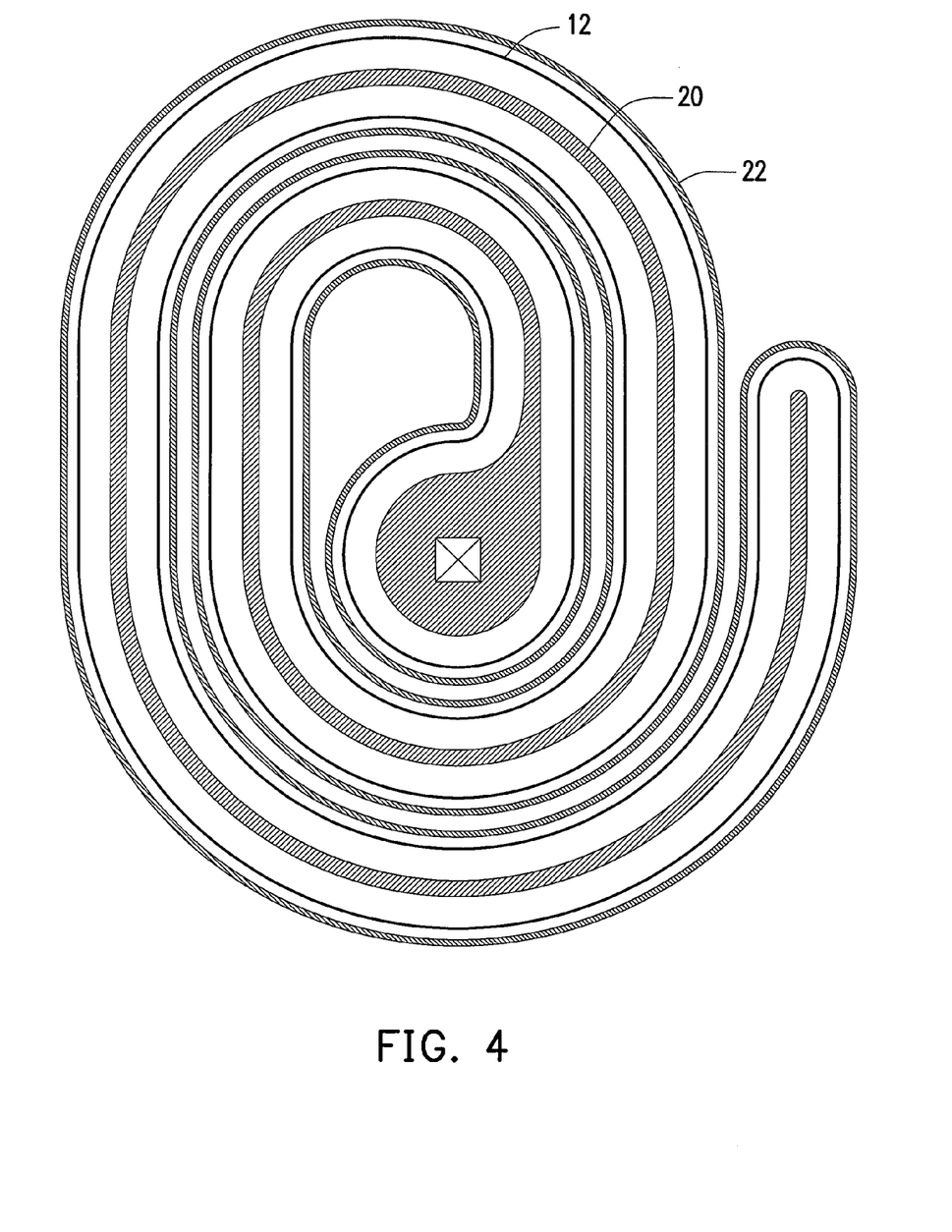
FIG. 4 shows a schematic diagram of a first well region of a first conductive type, a drain region, and a source region of a metal oxide semiconductor field transistor having a multiple-looped elliptical spiral-shaped drain with a water drop-shaped starting portion according to another embodiment of the invention.

FIG. 3 shows a top view of a metal oxide semiconductor field transistor having a single-looped elliptical spiral-shaped drain with a water drop-shaped starting portion according to another embodiment of the invention. FIG. 3A is a schematic diagram illustrating relative positions of a plurality of doped regions in a substrate of the metal oxide semiconductor field transistor in FIG. 3. A cross-sectional diagram taken along line A-A in FIG. 3 is identical to that in FIG. 1A and thus not shown additionally. FIG. 4 shows a schematic top view of a first well region of a first conductive type, a drain region, and a source region of a metal oxide semiconductor field transistor having a multiple-looped elliptical spiral-shaped drain with a water drop-shaped starting portion according to another embodiment of the invention.

Referring to FIGS. 3, 3A, 4, 1, and 1A, a structure of a metal oxide semiconductor field transistor 200 of the present embodiment is similar to that of the metal oxide semiconductor field transistor 100 shown in FIGS. 1 and 1A, where the drain region 20 also has an elliptical spiral shape. Nonetheless, in the present embodiment, referring to FIGS. 3 and 3A, the starting portion 20a of the drain region 20 has a water drop shape. A substrate 10a surrounded by a first loop of the first well region of the first conductive type 12 also has a water drop shape. Specifically, the first well region of the first conductive type 12 and the drain region 20 have similar shapes; however, the invention is not limited thereto. For example, the starting portion 12a and a terminating portion 12e of the first well region of the first conductive type 12 each have an arc shape, for example, a semi-circle shape, a quarter circle shape, an one-eighth circle shape, and so on. An arc radius of the starting portion 12a of the first well region of the first conductive type 12 can be larger than an arc radius of the terminating portion 12e of the first well region of the first conductive type 12, so that the substrate 10 surrounded by the first loop of the first well region of the first conductive type has a water drop shape. However, the shape of the first well region of the first conductive type (NW1) 12 is not limited thereto. The first well region of the first conductive type (NW1) 12 can also have a shape different from that of the drain region 20 as long as the drain region 20 is located in the first well region of the first conductive type (NW1) 12. Here, possible shapes are not described in details. Referring to FIGS. 3, and 3A, in an embodiment, the third well region of the second conductive type (PW3) 32 is included in the metal oxide semiconductor field transistor 200. A substrate 10b surrounded by the third well region of the second conductive type (PW3) 32 at a center of the metal oxide semiconductor field transistor 200 has a circular shape. Additionally, referring to FIG. 3A, it should be noted that since the starting portion 20a of the drain region 20 has an arc shape, where a curvature thereof ranges from 0.02 [1/μm] to 0.0025 [1/μm], for instance, the source region 22 around the starting portion 20a does not have a large electric field and a second well region of the second conductive type 28 is not required additionally to reduce the effect caused by a tip electric field. Moreover, the contact opening 38 is electrically connected to the starting portion 20a of the drain region 20.

In an embodiment, the drain region 20 of the metal oxide semiconductor field transistor 200 has a single-looped elliptical spiral shape (as shown in FIGS. 3, and 3A). In another embodiment, the starting portion 20a of the drain region 20 still has a water drop shape. However, the drain region 20 has a multiple-looped elliptical spiral shape (as illustrated in FIG. 4).

Figure 5:
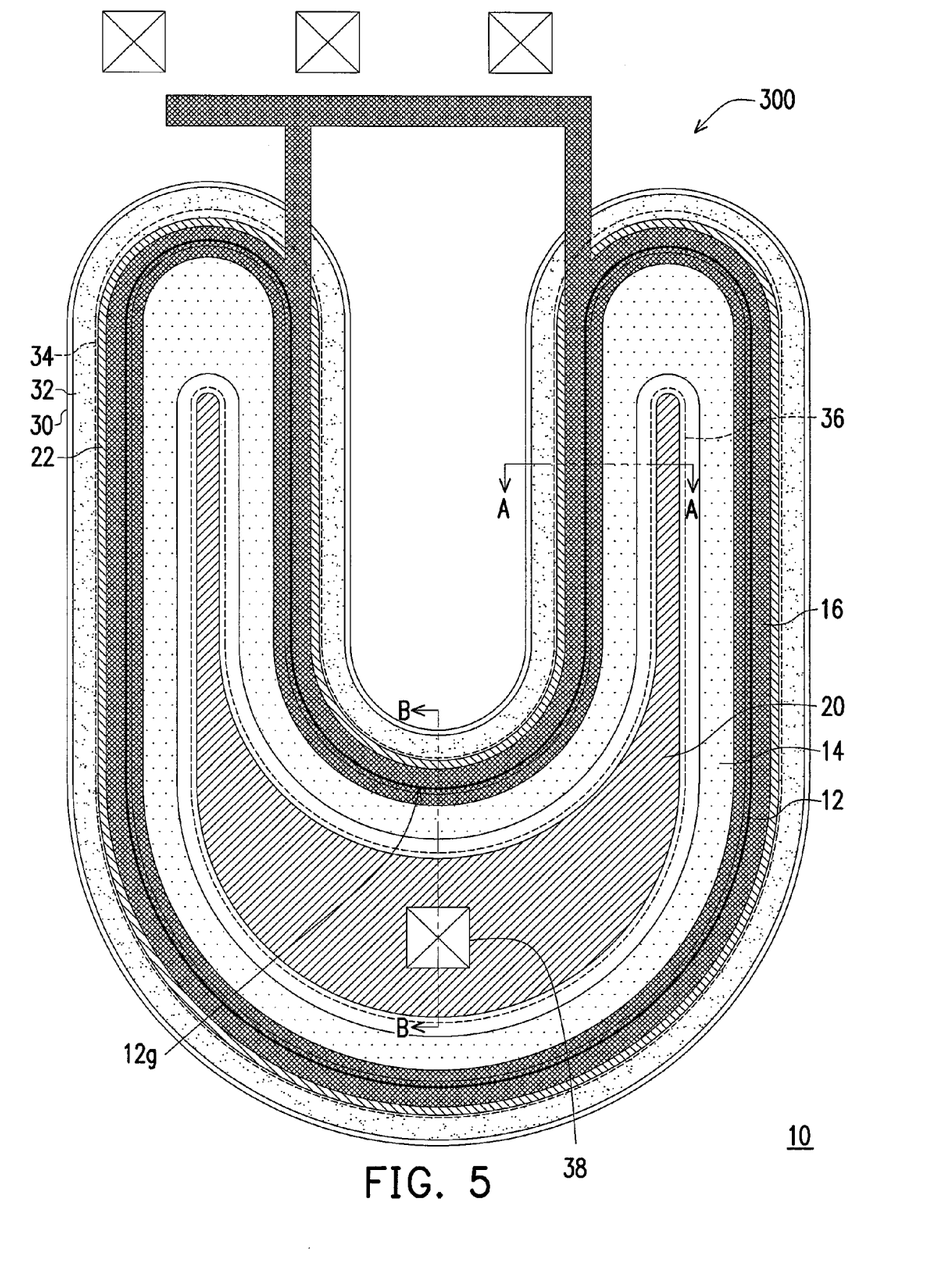
FIG. 5 depicts a perspective diagram of a U-shaped metal oxide semiconductor field transistor according to another embodiment of the invention.

FIG. 5 is a perspective diagram showing a U-shaped metal oxide semiconductor field transistor according to another embodiment of the invention. That is, in FIG. 5, an isolation structure is omitted so as to illustrate a plurality of doped regions below the isolation structure. A cross-sectional view taken along line A-A in FIG. 5 is identical to that in FIG. 2A. A cross-sectional view taken along line B-B in FIG. 5 is identical to that in FIG. 2B.

Referring to FIGS. 5, 1, and 1A, a metal oxide semiconductor field transistor 300 of the present embodiment has a U-shaped structure which is very similar to the structure of the metal oxide semiconductor field transistor 100 in FIGS. 1 and 1A. However, the drain region 20 in the metal oxide semiconductor field transistor 100 and the first well region of the first conductive type (NW1) 12 in FIGS. 1 and 1A both have an elliptical spiral shape. In FIG. 5 of the present embodiment, the drain region 20 and the first well region of the first conductive type (NW1) 12 are merely extracted from a portion of the first loop in FIG. 1. In other words, referring to FIG. 5, the drain region 20 and the first well region of the first conductive type (NW1) 12 both have a U shape. A curvature of a notch bottom 12g of the first well region of the first conductive type 12 ranges from 0.02 [1/μm] to 0.0025 [1/μm], for example. A curvature of the source region 22 surrounding the notch bottom 12g of the first well region of the first conductive type 12 ranges from 0.0065 [1/μm] to 0.001 [1/μm], for example. Since the botch bottom 12g of the first well region of the first conductive type 12 has a curvature that is sufficiently small, the source region 22 around the notch bottom 12g does not have a large electric field. Therefore, the second well region of the second conductive type 28 is not required additionally in the first well region of the second conductive type 14 to reduce the effect caused by the tip electric field. Further, the contact opening 38 is electrically connected to a bottom of the drain region 20 having a U shape.

Figure 6:
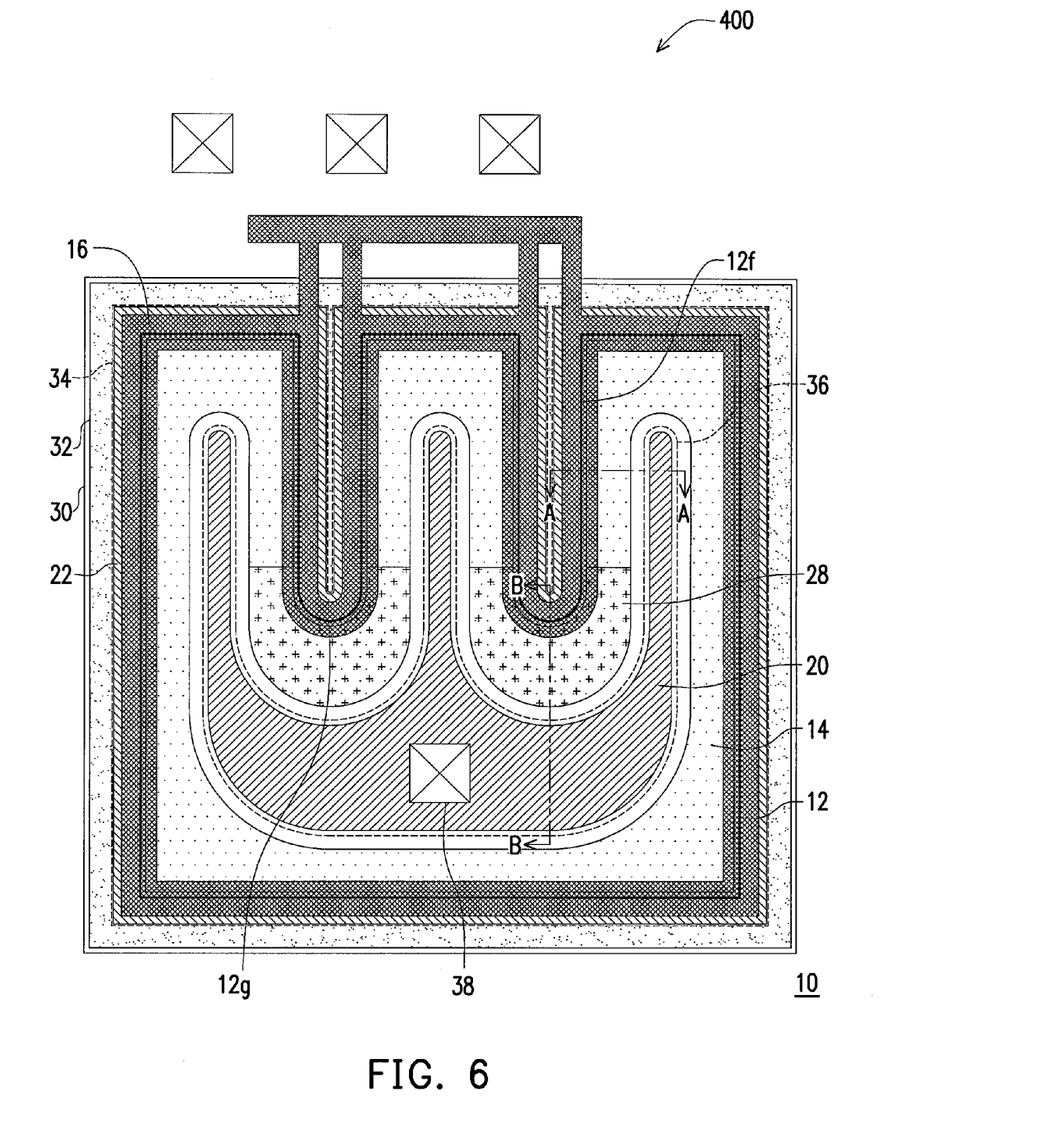
FIG. 6 depicts a perspective diagram of a W-shaped metal oxide semiconductor field transistor according to another embodiment of the invention.

FIG. 6 is a perspective diagram showing a W-shaped metal oxide semiconductor field transistor according to another embodiment of the invention. That is, in FIG. 6, an isolation structure is omitted so as to illustrate a plurality of doped regions below the isolation structure. A cross-sectional view taken along line A-A in FIG. 6 is identical to that in FIG. 2A. A cross-sectional view taken along line B-B in FIG. 6 is identical to that in FIG. 2B.

Referring to FIGS. 6, 1, and 1A, a structure of a metal oxide semiconductor field transistor 400 of the present embodiment can be deemed as a variation of the structures of the metal oxide semiconductor field transistors in FIGS. 1, and 1A. More specifically, in the present embodiment, the drain region 20 and the first well region of the first conductive type (NW1) 12 are extracted from a portion of the first loop having a U shape in FIG. 1. The two U shapes are overlapped respectively to form a W-like shape (or an E shape rotated counterclockwise). The first well region of the first conductive type (NW1) 12 has a large W shape (a large E rotated counterclockwise) and the drain region 20 has a small W shape (a small E rotated counterclockwise). The drain region 20 is located in a region surrounded by the source region 22. That is, the source region 22 is around the drain region 20. Here, two portions of the source region 22 extending to two notches 12f of the first well region of the first conductive type (NW1) 12 have a U shape respectively. The U shapes each have a narrow center. Thus, the U shapes are similar to strip shapes. That is, high electric fields are generated at the tips of the bottoms of the U shapes. As a consequence, the second well region of the second conductive types 28 are additionally formed in the first well region of the second conductive type 14 of the two notch bottoms 12g, such that the second well region of the second conductive type 28 is located around the bottoms of the U-shaped source regions 22 to reduce the effect caused by the tip electric field. The two second conductive type second well region 28 has a horseshoe shape, for instance. Furthermore, the contact opening 38 is electrically connected to the bottom of the drain region 20 having a W shape.

Figure 7:
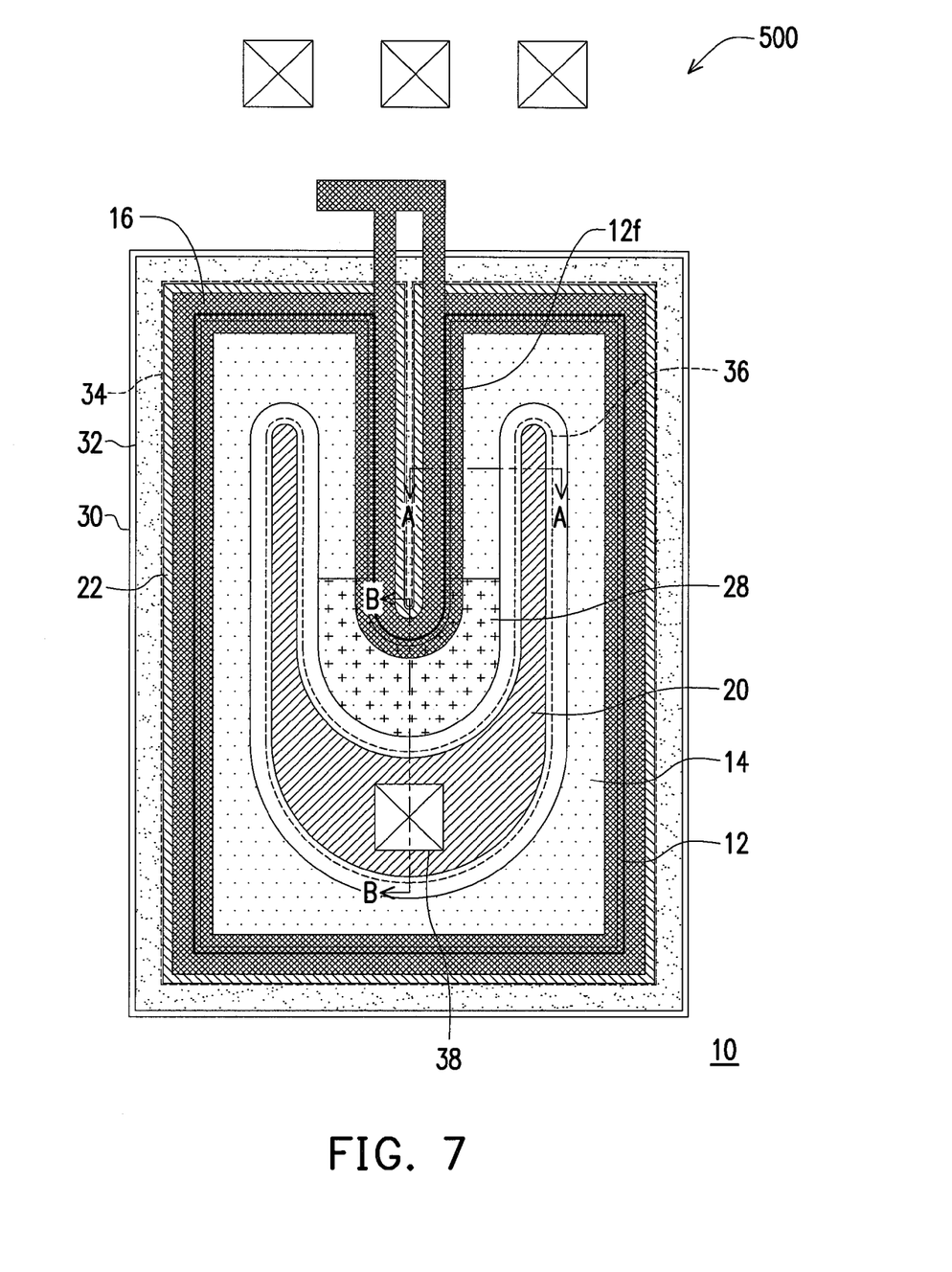
FIG. 7 is a perspective diagram of a metal oxide semiconductor field transistor according to another embodiment of the invention.

FIG. 7 is a perspective diagram showing a metal oxide semiconductor field transistor according to another embodiment of the invention. In FIG. 7, an isolation structure is omitted so as to illustrate a plurality of doped regions below the isolation structure. A cross-sectional view taken along line A-A in FIG. 7 is identical to that in FIG. 2A. A cross-sectional view taken along line B-B in FIG. 7 is identical to that in FIG. 2B.

Referring to FIGS. 7, 1, and 1A, a structure of a metal oxide semiconductor field transistor 500 of the present embodiment can be deemed as a variation of the structure of the metal oxide semiconductor field transistor in FIG. 6. To be specific, in the present embodiment, the drain region 20 and the first well region of the first conductive type (NW1) 12 are extracted from a portion having a U shape in FIG. 6. The source region 22 surrounds the drain region 20. Here, the portion of the source region 22 extending to the notch 12f of the first well region of the first conductive type (NW1) 12 has a U shape. The U shape has a narrow center. Thus, the U shape is similar to a strip shape. That is, a high electric field is generated at the tip of the bottom of the U shape. As a consequence, the second well region of the second conductive type 28 is additionally formed in the first well region of the second conductive type 14 around the bottom of the U-shaped source region 22 in the notch 12f to reduce the effect caused by the tip electric field. The second well region of the second conductive type 28 has a horseshoe shape, for instance. Furthermore, the contact opening 38 is electrically connected to the bottom of the drain region 20.

In the embodiments aforementioned, the doped regions in the substrate are shown as well regions for better illustration of the embodiments of the invention. However, the embodiments are not limited to well regions in practice and can also be doped regions.

Figure 8:
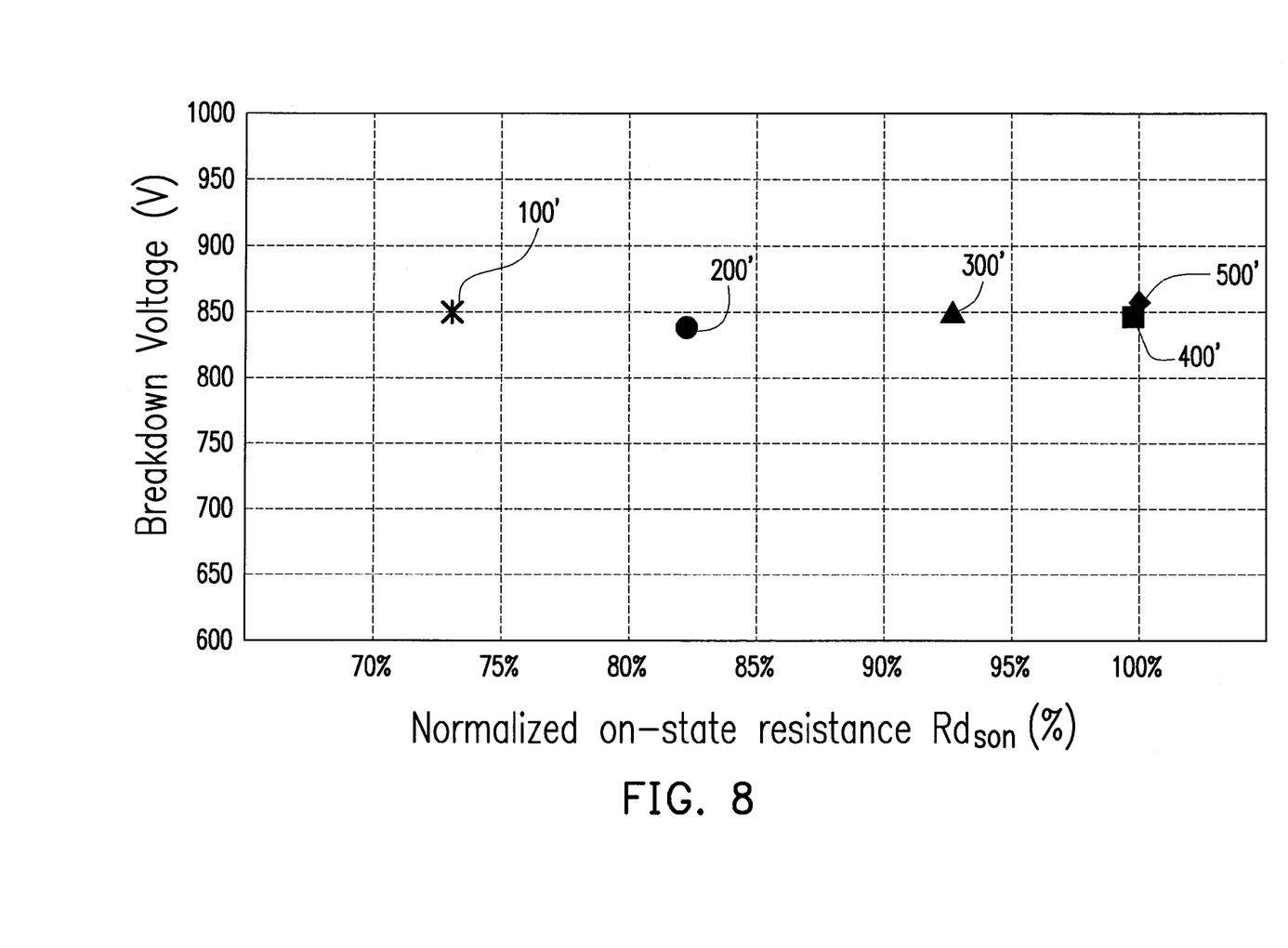
FIG. 8 is a diagram showing an electrical property test of a plurality of metal oxide semiconductor field transistors with similar areas.

FIG. 8 is a diagram showing an electrical property test of the metal oxide semiconductor field transistors 100, 200, 300, 400, and 500 having similar areas (the areas are each 700 μm×500 μm). In FIG. 8, a plurality of points 100', 200', 300', 400', and 500' each represents a testing result of the metal oxide semiconductor field transistor 100, 200, 300, 400 and 500. The results in FIG. 8 show that an on-state resistance $Rd_{son}$ of the transistor 500 to the transistor 100 decreases gradually under the same breakdown voltage, where a decrease amplitude thereof is 26.8%.

In summary, the source region of the metal oxide semiconductor field transistor in the invention has a curvature that is sufficiently small, so that the current is prevented from accumulating at the source terminal. Alternatively, when the source region has a large curvature at the tip, the second well region of the second conductive type can be formed to prevent the accumulation of current at the source terminal. Therefore, the metal oxide semiconductor field transistor of the invention is not only applied as a high voltage device, but can also decrease the layout area, elevate the breakdown voltage of the device, and lower the on-state resistance of the device.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A metal oxide semiconductor field transistor, comprising:
   a drain region located in a substrate, the drain region being of a first conductive type and having an elliptical spiral shape, and a starting portion thereof having a shape of a strip or a water drop, or having a curvature of 0.02 [1/μm] to 0.0025 [1/μm];
   a source region, being of the first conductive type, located in the substrate, and surrounds the drain region;
   a gate, disposed above the substrate located between the source region and the drain region; and
   a gate dielectric layer located between the gate and the substrate.

2. The metal oxide semiconductor field transistor as claimed in claim 1, wherein the starting portion having the strip shape in the drain region is constituted by an arc portion and a rectangular portion.

3. The metal oxide semiconductor field transistor as claimed in claim 1, wherein the drain region has a single loop of the elliptical spiral.

4. The metal oxide semiconductor field transistor as claimed in claim 1, wherein the drain region has a plurality of loops of the elliptical spirals.

5. The metal oxide semiconductor field transistor as claimed in claim 1, further comprising:
   a first doped region of the first conductive type, located between the drain region and the substrate; and
   a first doped region of a second conductive type, located in the first doped region of the first conductive type and surrounding the drain region.

6. The metal oxide semiconductor field transistor as claimed in claim 5, wherein a doping dosage of the first doped region of the second conductive type is higher than a doping dosage of the first doped region of the first conductive type.

7. The metal oxide semiconductor field transistor as claimed in claim 5, wherein a first turn of the first doped region of the first conductive type has a semi-circular shape.

8. The metal oxide semiconductor field transistor as claimed in claim 7, further comprising a second doped region of the second conductive type located in the first doped region of the second conductive type, wherein the first doped region of the second conductive type containing the second doped region of the second conductive type is located at the first turn of the first doped region of the first conductive type surrounding the source region, wherein a sum of the doping dosage of the first doped region of the second conductive type and a doping dosage of the second doped region of the second conductive type is higher than the doping dosage of the first doped region of the first conductive type.

9. The metal oxide semiconductor field transistor as claimed in claim 5, further comprising a second doped region of the first conductive type and a third doped region of the second conductive type, wherein
   the second doped region of the first conductive type is located in the substrate around the first doped region of the first conductive type; and
   the third doped region of the second conductive type is located in the second doped region of the first conductive type and the source region is located in the third doped region of the second conductive type.

10. The metal oxide semiconductor field transistor as claimed in claim 9, wherein a region enclosed by the third doped region of the second conductive type in a center of the metal oxide semiconductor field transistor has a circular shape.

11. The metal oxide semiconductor field transistor as claimed in claim 9, further comprising two heavily doped regions of the first conductive type located in the third doped region of the second conductive type and the first doped region of the first conductive type respectively.

12. The metal oxide semiconductor field transistor as claimed in claim 11, wherein the source region and the drain region are disposed in the heavily doped regions of the first conductive type respectively.

13. The metal oxide semiconductor field transistor as claimed in claim 1, further comprising a lightly doped region of the first conductive type located in the substrate between the source region and the gate to be electrically connected to the source region.

14. The metal oxide semiconductor field transistor as claimed in claim 1, further comprising a contact opening electrically connected to a first turn of the drain region.

15. The metal oxide semiconductor field transistor as claimed in claim 1, further comprising a contact opening electrically connected to the starting portion of the drain region.

16. The metal oxide semiconductor field transistor as claimed in claim 1, wherein when the first conductive type is an N-type, the second conductive type is a P-type; when the first conductive type is a P-type, the second conductive type is an N-type.

17. The metal oxide semiconductor field transistor as claimed in claim 1, wherein the drain region is completely enclosed by the source region.

* * * * *